United States Patent
Babic et al.

(10) Patent No.: US 6,222,202 B1
(45) Date of Patent: Apr. 24, 2001

(54) SYSTEM AND METHOD FOR THE MONOLITHIC INTEGRATION OF A LIGHT EMITTING DEVICE AND A PHOTODETECTOR FOR LOW BIAS VOLTAGE OPERATION

(75) Inventors: Dubravko I. Babic, Palo Alto; Scott W. Corzine, Sunnyvale, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/167,961

(22) Filed: Oct. 6, 1998

(51) Int. Cl.$^7$ .................................................. H01L 33/00
(52) U.S. Cl. ................................. 257/85; 257/84; 257/928
(58) Field of Search .................................. 257/84, 85, 928

(56) References Cited

U.S. PATENT DOCUMENTS

| | | | |
|---|---|---|---|
| 5,136,603 | 8/1992 | Hasnain et al. | 372/50 |
| 5,212,706 | 5/1993 | Jain | 372/50 |
| 5,606,572 | 2/1997 | Swirhun et al. | 372/96 |
| 5,648,979 | 7/1997 | Mun et al. | 372/50 |
| 5,663,944 | 9/1997 | Mun | 369/121 |
| 5,757,837 | 5/1998 | Lim et al. | 372/50 |
| 5,793,790 | * 8/1998 | Doi | 257/85 |

FOREIGN PATENT DOCUMENTS 06037300   2/1994   (JP) ............................... H01L/27/15

OTHER PUBLICATIONS

Lim, S.F., "Intercavity Resonant Quantum–Well Photodetection of a Vertical–Cavity Surface–Emitting Laser", Electronic Letters, GB, IEE Stevenage, vol. 33, No. 7, Mar. 27, 1997, pp. 597–598.

* cited by examiner

*Primary Examiner*—Jerome Jackson, Jr.

(57) ABSTRACT

A light emitting device and photodetector combination having a structure where the layer of the photodetector that contacts the light emitting device has a semiconductor conductivity type polarity opposite that of the light emitting device. This configuration results in a light emitting device and photodetector structure that has a very low bias voltage requirement. Additionally, by shunting any current flowing through the junction formed where the light emitting device meets the photodetector, the bias voltage requirement is further reduced.

5 Claims, 4 Drawing Sheets

LIGHT OUT

SYSTEM AND METHOD FOR THE MONOLITHIC INTEGRATION OF A LIGHT EMITTING DEVICE AND A PHOTODETECTOR FOR LOW BIAS VOLTAGE OPERATION

BACKGROUND OF THE INVENTION

1. Field of the Invention

The present invention relates generally to light emitting devices, and, more particularly, to a system and method for the monolithic integration of a light emitting device and a photodetector for low bias voltage operation.

2. Related Art

Semiconductor light emitting devices in general and vertical cavity surface emitting lasers (VCSEL's) in particular are used for many applications including electronics, communication systems, and computer systems. Lasers produce light that can be transmitted directionally. In many applications of lasers, and particularly in many VCSEL applications, there is a need to precisely control the laser output power. The output power of semiconductor lasers is primarily determined by the bias current. However, it can be significantly altered by the ambient temperature and aging of the device. For this reason, control of the output power is realized by monitoring the laser output and adjusting the laser current to maintain a specified laser output power. The light measurement is typically performed using a semiconductor photodetector, while the feedback loop is realized using an external electronic circuit. There are numerous implementations of such laser-photodetector systems, and they differ in application and performance.

The two primary design issues relating to the laser-photodetector system are the cost of the device and the ability to provide performance required for a specific application. From a cost perspective, it is desirable to build the laser and the photodetector on the same chip using the same or similar fabrication technology. This is realized by monolithic integration of the laser and the photodetector. Monolithic integration implies that the individual laser and photodetector devices are completed jointly at the wafer level. From a performance perspective, there are a number or desired qualities. The detector current should track the directional light output from the laser, while minimizing the capture of the omni-directional spontaneous emission. The relationship between the directional laser output power and the photodetector current should be stable and repeatable. For proper operation the photodetector current should be within the range needed by the external analog feedback circuit. The existence of the photodetector and its biasing should have a negligible effect on the operation of, and in particular, the modulation properties of the laser. The laser modulation and biasing should have a negligible effect on the operation of the photodetector.

Lastly, the driver circuit must be considered. In computer communications applications the minimum bias voltage is an issue of increasing importance due to the desire to reduce computer power consumption. Today's computer architectures are using 3.3 volt (V) power supplies having a lower limit of approximately 3.1V. In the future and for other applications it is foreseeable that the power dissipation will be reduced even further requiring even lower bias voltage levels.

A preferable configuration of the laser-photodetector system is one in which the laser and photodetector are independently biased from the same power supply. In order to achieve this result, the power supply voltage must be larger than the laser operating voltage, which depends on the photon energy, and the photodetector operating voltage, which depends upon the photodetector reverse bias required for efficient performance. For optical communications, the vertical cavity laser voltages range between approximately one to two volts, while the typical photodetector reverse bias voltage is between 0.5 and 1 volt. For other applications these voltages may vary.

An integrated laser and photodetector structure that enables independent biasing of the laser and the photodetector uses the lowest bias voltage. This is achievable by using a four terminal device structure in which two terminals are jointly connected to the power supply, thereby allowing arbitrary relative polarity between the laser and the photodetector. In three terminal monolithically integrated devices, the relative polarity between the laser and the photodetector is not arbitrary due to fabrication limitations.

In the past, photodetectors have been integrated with lasers with varying degrees of success. For example, some integration schemes use a photodetector and laser that have been independently fabricated on different chips. The two devices are integrated at the packaging stage, after fabrication, resulting in arbitrary relative polarity between the laser and photodetector. This integration scheme is referred to as "hybrid integration". The primary disadvantage of this approach is that the extra processing step of integrating the photodetector with the laser after fabrication undesirably adds manufacturing cost. Additionally, in many cases the relationship between the photodetector current and the laser output is neither stable nor repeatable, due to the fluctuation in the laser output beam shape.

Another scheme involves monolithic integration of a photodetector and laser where the coupling is realized using side emission, resulting in both three or four terminal devices. The main disadvantage of such devices is that the photodetector does not detect the directional laser output, but predominately captures the omni-directional spontaneous emission.

Finally, another scheme involves the monolithic integration of a laser and a photodetector where the coupling is realized by top (or bottom) emission, resulting in both three and four terminal devices.

All of the implementations result in either three terminal devices where the laser and the photodetector share a common n-side (cathode) or a common p-side (anode), which as will be shown require a relatively high bias voltage for operation and in which the laser and the photodiode are electrically coupled; or in four terminal devices, which are difficult and costly to fabricate. Therefore, a monolithically-integrated three terminal device that can operate at a low bias voltage, such as 3.3V, and enables electrical de-coupling between the laser and the photodetector is desired.

Figure 1A:
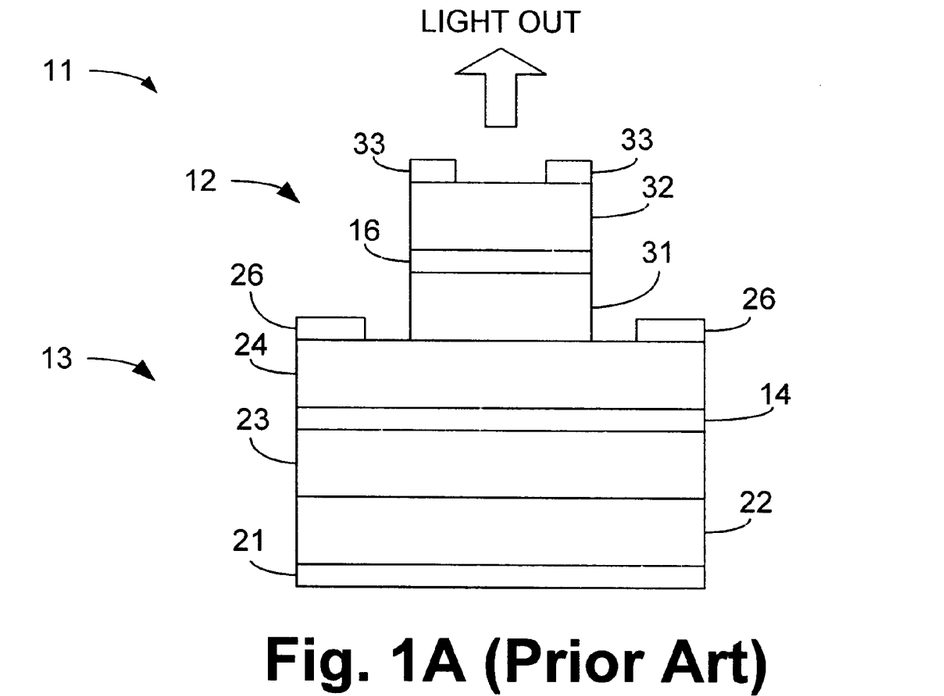
FIG. 1A is a cross-sectional view of a prior art laser and photodetector.

Shown in FIG. 1A is a prior art laser and photodetector combination in a three terminal configuration. Laser and photodetector 11 is essentially comprised of photodetector 12 deposited over laser 13 in a common cathode arrangement. The common cathode configuration is also referred to as PNP configuration because the semiconductor conductivity type changes twice in the structure. Laser 13 is typically a vertical cavity surface emitting laser (VCSEL). This arrangement is illustratively characterized as having two PN junctions. The first PN junction is active layer 14 located within laser 13 and the second PN junction is the absorbing layer 16 within photodetector 12. The laser 13 comprises a p-type substrate 22 on the bottom of which a p-type contact layer 21 is deposited. Over the substrate 22 is p-type mirror 23. Active region 14, which includes an n-type material and a p-type material separated by a light generating medium is grown over p-type mirror 23. Over active region 14 is n-type mirror 24, over which is grown n-type contact material 26.

Immediately upon n-type mirror 24 is n-type layer 31 of photodetector 12, over which absorbing layer 16 and p-type layer 32 are grown. Layers 32, 16, and 31 comprise a photodetector having a PIN structure. Over the p-type material 32 is p-type contact material 33. A fraction of the light emitted from the laser 13 is absorbed in the photodetector 12 and the balance is emitted from the device in the direction of the arrow shown in FIG. 1A.

Figure 1B:
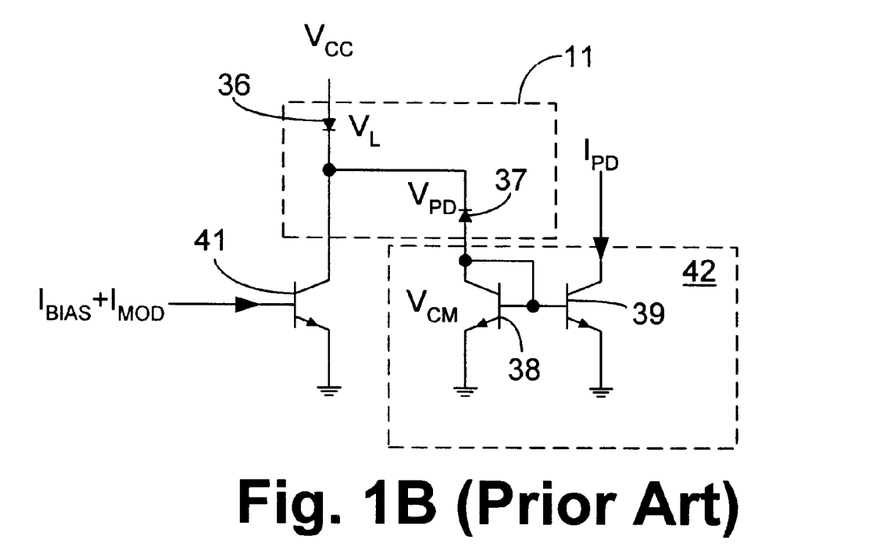
FIG. 1B is a schematic representation of the prior art laser and photodetector of FIG. 1A including exemplary external biasing circuitry associated therewith.

FIG. 1B is a schematic representation of the prior art laser and photodetector of FIG. 1A including exemplary external circuitry associated therewith. The dotted box surrounding diode 36 and diode 37 illustrates laser and photodetector 11, where diode 36 represents the laser 13 and the diode 37 represents the photodetector 12. Laser driver transistor 41 and the current mirror formed by transistors 38 and 39 are illustratively depicted using NPN bipolar transistors. The use of NPN transistors in the amplifiers is common due to the requirement for high speed combined with the higher gain of the NPN transistor with respect to a PNP configuration (although the use of PNP transistors is not excluded).

The minimum bias voltage $V_{CC}$ necessary for the operation of this circuit is greater than the sum of the smallest individual PN junction voltages and can be expressed by the following relationship.

$$V_{CC} > V_L + V_{PD} + V_{CM} \quad \text{(Equation 1)}$$

where, $V_L$ is the VCSEL forward bias voltage across laser diode 36 at the laser operating current, $V_{PD}$ is the reverse bias across photodetector diode 37, and $V_{CM}$ is the forward bias on the transistor 38 in the current mirror 42 formed by transistors 38 and 39. Typically, the values of these voltages are $V_L \approx 1.7V$, $V_{PD} \approx 0.5V$, and $V_{CM} \approx 0.8V$. In this example, $V_{CM} \approx 0.8V$ corresponds to a silicon bipolar transistor and may be greater or less than 0.8V depending upon the type of transistor and the material of which the transistor is constructed. This yields a minimum bias voltage $V_{CC} > 3V$. It is desirable to minimize the bias voltage $V_{CC}$ such that overall system voltage consumption is minimized. The aforementioned laser and photodetector leaves very little cushion in a system having a 3.1V minimum power supply.

Furthermore, in the foregoing example, transistor 41 drives both laser 36 and photodetector diode 37, in which the parasitic capacitance of the photodetector 37 loads transistor 41, thus limiting the frequency response of the laser. In addition, the adjustment of the operating point of the laser 36 to reach a specified output power inherently modifies the operating point of the photodetector 37, which is a highly undesirable side-effect of this configuration. Thus, an unaddressed need exists in the industry for a three terminal monolithically integrated laser and photodetector arrangement that operates using a low bias voltage and that provides electrical de-coupling between the laser and the photodetector.

SUMMARY OF THE INVENTION

The invention provides a light emitting device and photodetector in a three-terminal monolithically-integrated structure which enables operating bias voltages that are lower than previously achievable, and provides electrical de-coupling between the light emitting device and the photodetector. Although not limited to these particular applications, the system and method of the present invention are particularly suited for monolithically integrating a photodetector and a vertical cavity surface emitting laser (VCSEL) in a novel configuration that minimizes power consumption. The system and method for the monolithic integration of a light emitting device and photodetector for low bias voltage operation can be implemented using a variety of epitaxially grown semiconductor materials having various electrical properties. For example, the material layers to be described below in a preferred and several alternative embodiments can be of either n-type or p-type material without departing from the concepts of the invention.

In architecture, the present invention can be conceptualized as a system for measuring the output of a light emitting device comprising a light emitting device having a corresponding operating current and a photodetector optically coupled to the light emitting device. The photodetector also has a corresponding operating current. The light emitting device and photodetector are integrated into a single device and a parasitic PN junction is formed at the junction between the light emitting device and photodetector.

In an alternative embodiment of the monolithically integrated light emitting device and photodetector, the parasitic PN junction formed at the junction of the light emitting device and photodetector is shorted.

In yet another embodiment of the monolithically integrated light emitting device and photodetecotor, the photodetector and the parasitic PN junction are formed within one of the mirrors of the light emitting device.

The present invention may also be conceptualized as providing a method for constructing a monolithically integrated light emitting device and photodetector for low bias voltage operation, comprising the following steps.

A light emitting device is formed, the light emitting device having a corresponding operating current. A photodetector is incorporated with the light emitting device, the photodetector also having a corresponding operating current. At the intersection of the light emitting device and photodetector a PN junction is formed.

The invention has numerous advantages, a few which are delineated, below, as merely examples.

An advantage of the invention is that it permits the measurement of the light output of a light emitting device in a configuration that significantly reduces the operating bias voltage with respect to prior art.

Another advantage of the invention is that the photodetector and the light emitting device are electrically decoupled, thereby enabling independent biasing of the light emitting device and the photodetector, and eliminating the unnecessary loading of the light emitting device driver circuit by the photodetector parasitic capacitance, thereby improving the high-frequency response of the device with respect to prior art.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings.

The components within the drawings are not necessarily to scale relative to each other, emphasis instead being placed upon clearly illustrating the principles of the present invention.

DETAILED DESCRIPTION OF THE PREFERRED EMBODIMENT

The present invention is typically implemented by growing epitaxial material layers having various electrical properties and can be implemented using a variety of substrate and epitaxial growth materials. Furthermore, while described in the context of a vertical cavity surface emitting laser (VCSEL) having a monolithically integrated photodetector, the present invention is applicable to other light emitting structures, for example but not limited to, light emitting diodes (LED's). Furthermore, the current and optical mode confinement in the VCSEL may be accomplished by lateral oxidation, insulating implantation, or other suitable techniques that are known in the art.

Figure 2A:
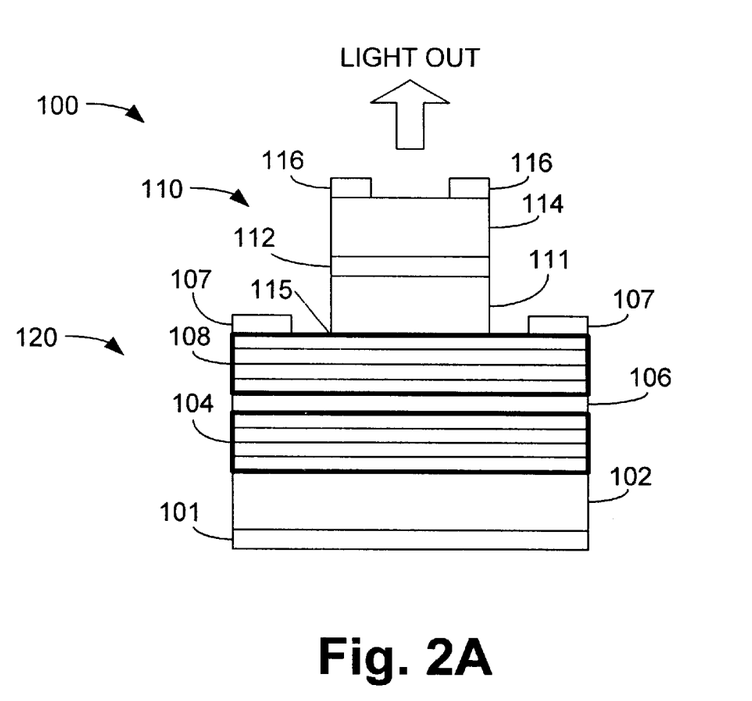
FIG. 2A is a cross-sectional view of a laser and photodetector constructed in accordance with the present invention.

Turning now to FIG. 2A, shown is a cross-sectional view of a laser and photodetector assembly 100 constructed in accordance with the present invention. In this preferred embodiment, the photodetector 110 resides over the VCSEL 120.

The foundation of the laser structure 120 is formed with an n-type substrate layer 102, on the bottom of which an n-type contact layer 101 is deposited. N-type bottom mirror 104 is grown over substrate layer 102 and has active region 106 grown thereupon. It should be noted that while illustrated using few layers, the mirror layers referred to are typically comprised of many multiple layers of material and are also referred to as "distributed Bragg reflectors" or "mirrors".

Active region 106 includes n-type material and p-type material surrounding a light amplifying medium. A PN junction is a junction between two layers of different semiconductor conductivity type. The junction may contain any number of low doped or undoped layers, and any number of different materials forming quantum wells or bulk semiconductor layers. The function of the intermediate layers in the active region 106 is to generate and amplify light traversing the junction.

Upon active region 106 is grown p-type top mirror 108, and p-type contact material 107. Upon p-type top mirror 108 is grown the bottom transparent n-type material layer 111 of the photodetector 110. The junction of the p-type top mirror 108 of the VCSEL 120 and the n-type bottom transparent layer 111 of the photodetector 110 forms the second PN junction 115, also referred to as a parasitic PN junction. This junction allows the present invention to operate at a low bias voltage level, the operation of which will be discussed in detail below with reference to FIGS. 2B, 3B and 4B.

A third PN junction of PIN type is formed by the n-type bottom transparent layer 111, absorbing layer 112, and a transparent p-type top layer 114 grown over absorbing layer 112. Upon p-type top layer 114 is deposited p-type contact material layer 116 approximately as shown. The PIN junction type is characterized by any number of low doped or undoped layers, or any number of different materials forming quantum wells or bulk semiconductor layers residing between one p-type and one n-type layer. The function of the intermediate layers in a PIN junction of photodetector 110 is to partially absorb light traversing the junction.

This device arrangement results in a laser and photodetector combination in a PNPN configuration. The PNPN configuration refers to the laser and photodetector structure 100 in which the semiconductor conductivity type alternates three times between p-type material and n-type material when traversing from the substrate layer 102 to the top surface of the photodetector 110. Specifically, active layer 106 is a first PN junction having a PIN structure, junction 115 where the laser 120 meets the photodetector 110 is the second PN junction, and absorbing layer 112 is a third PN junction having a PIN structure. This arrangement results in the PNPN configuration mentioned above. The PNPN configuration contemplates a structure in which layers of different semiconductor conductivity type may appear above or below the layers forming the integrated laser and photodetector.

The arrow above laser and photodetector assembly 100 indicates the light output of this preferred embodiment. It should be noted that the material layers can be reversed (i.e., all n-type layers replaced with p-type layers and all p-type layers replaced with n-type layers).

The transparent layers in the photodetector may be partially absorbing. Since the output light can be taken from either the top or the bottom of the laser, the detector may be placed on either side of the laser without departing from the concept of the invention. If the detector is placed in the path of the laser output beam, then the absorbing layer 112 may be designed to absorb only a fraction of the laser output power while the rest of the light is emitted from the device. If, on the other hand, the detector is placed on the opposite side of the laser output mirror, then the detector absorbing layer may be designed to absorb all of the light that traverses the detector. The latter structure is not shown, but it will be clear to those skilled in the art that the location of the detector and the mirror through which the light is taken or absorbed can be arbitrarily varied without departing from the basic concept of the invention.

Contact layer 101, which contacts n-type bottom mirror 102, p-type contact layer 107, which contacts p-type top mirror 108, and p-type contact layer 116, which contacts the top transparent p-type material layer 114 of photodetector 110, form three contacts. These three contacts, together with the aforementioned photodetector structure having the n-type bottom layer 111 of photodetector 110, contact the p-type top mirror 108 of VCSEL 120, enable the laser and photodetector to significantly reduce the required bias voltage, the circuitry of which will be described below.

It should be evident that the n-type contact to the active layer 106 may be realized by using a contact deposited directly on the n-type mirror layer 104 at a location distanced laterally from the p-type contact 107, rather than through the substrate 102, without departing from the concept of the invention.

Figure 2B:
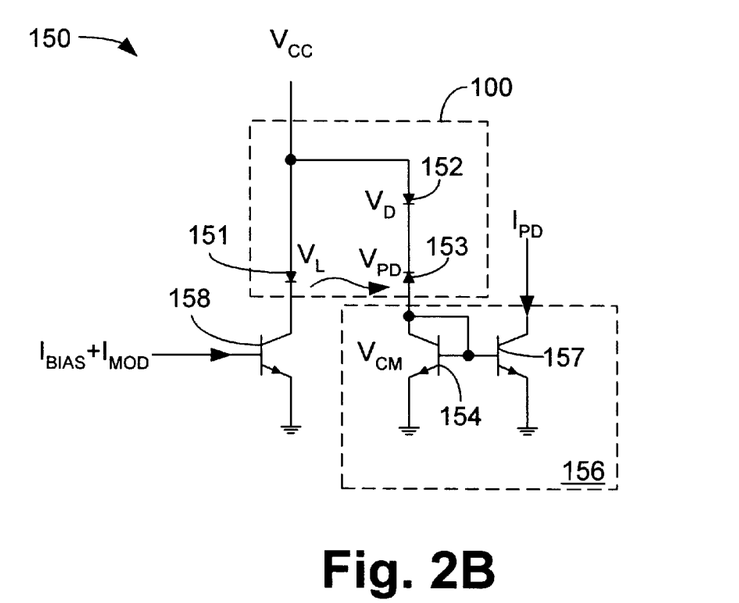
FIG. 2B is a schematic representation of the laser and photodetector of FIG. 2A including simplified external biasing circuitry associated therewith.

FIG. 2B is a schematic representation 150 of the laser and photodetector 100 of FIG. 2A including simplified external biasing circuitry associated therewith, which will be used to illustrate the low bias voltage and electrically de-coupled operation of a preferred embodiment of the invention.

Illustratively, the laser and photodetector 100 are shown as diodes 151, 152, and 153 enclosed in the dotted box 100, which represents the laser and photodetector of FIG. 2A. The voltage across diode 151 represents the voltage $V_L$ across VCSEL 120, the voltage $V_D$ across diode 152 represents the forward bias voltage across PN junction 115, and the voltage $V_{PD}$ across diode 153 represents the reverse bias voltage across the photodetector 110 at the photodetector operating current. The simplified laser driver circuit 158 controls the bias current $I_{BIAS}$ and the modulation current $I_{MOD}$ through the laser 120.

The minimum bias voltage necessary for the operation of this circuit is greater than the sum of the smallest individual PN junction operating voltages and can be expressed by the following relationship.

$$V_{CC} > V_D + V_{PD} + V_{CM} \quad \text{(Equation 2)}$$

where VD is the forward bias voltage of the parasitic PN junction 152 at the photodetector 153 operating current, $V_{PD}$ is the reverse bias on the photodetector 153, and $V_{CM}$ is the forward bias voltage on the transistor 154 in the current mirror circuit 156, formed by transistors 154 and 157. Current mirror 156 measures the current flowing through the photodetector 110, and is shown herein illustratively.

By comparing formula (1) of the prior art, with formula (2) described above, it can be seen that the bias voltage $V_{CC}$ required by laser and photodetector 100 can be lower if the forward bias voltage $V_D$ of the parasitic PN junction across diode 152 is lower than the forward bias voltage $V_L$ of the VCSEL (i.e., $V_D < V_L$), where $V_L$ is the VCSEL forward bias voltage at the laser operating point.

This condition will typically be satisfied for the following reasons. First, the series resistance of the VCSEL 120 is typically larger than the resistance of the parasitic PN junction 115 because of the longer current path in the laser 120. Second, the operating points of VCSEL 120 (containing the first PN junction) and the parasitic PN junction 115 (second PN junction) are different. The laser operates in the range of several milliamperes (mA), while the detector current, which also flows through the parasitic PN junction 115, is generally less than 0.5 mA.

To illustrate with an example, assuming typical values of $V_D \approx 1.2V$, $V_{PD} \approx 0.5V$, and $V_{CM} \approx 0.8V$, has $V_{CC} > 2.5V$. The quoted voltage across the parasitic PN junction 115 (VD≈1.2V) is typical of a gallium arsenide homojunction, but can be reduced further by, for example but not limited to, bandgap engineering, i.e., heavy doping, grading, and using other semiconductor materials as known in the art. In addition, $V_{CM} \approx 0.8V$ corresponds to a silicon bipolar transistor and may be greater or less than 0.8V depending upon the transistor used and the material of which the transistor is constructed. The aforementioned example represents a 0.5V improvement over prior art and allows a 0.6V cushion in a system having a 3.1V minimum power supply voltage.

It is important to note that since the laser and the photodetector circuit branches are being biased from the same power supply, the lowest circuit bias voltage $V_{CC}$ is also limited by the sum of the operating voltage of the laser $V_L$ and the voltage on the driver transistor 158.

It should be evident that the preferred embodiment shown in FIG. 2B exhibits the desired relative polarity between the laser and the photodetector within a three-terminal terminal device, which enables the use of a single power supply to simultaneously forward-bias the laser and reverse-bias the photodetector. It should be furthermore evident that in the same configuration the laser current and the photodetector current separately depend on the individual bias conditions of the laser and the photodetector, and are entirely independent of each other. The latter constitutes the electrical decoupling feature of the laser and the photodetector of the present invention.

Figure 3A:
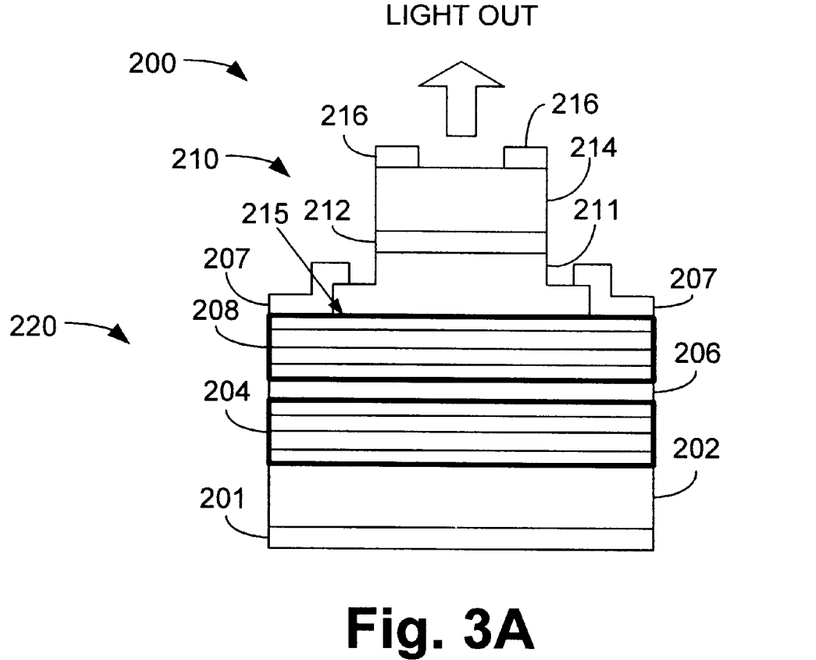
FIG. 3A is a cross-sectional view of a first alternative embodiment of the laser and photodetector of FIG. 2A.

FIG. 3A is a cross-sectional view of a first alternative embodiment 200 of the laser and photodetector of FIG. 2A. In a manner similar to that described with respect to the laser and photodetector 100 of FIG. 2A, first alternative embodiment 200 of the laser and photodetector of the present invention is constructed as follows.

The foundation of the laser structure is formed with an n-type substrate layer 202, upon which an n-type contact layer 201 is deposited. N-type bottom mirror 204 is grown over substrate layer 202 and has active region 206 grown thereupon. Active region 206 includes n-type material and p-type material surrounding a light generating medium and is similar to that described with respect to FIG. 2A. Active region 206 forms the first PN junction in laser and photodetector assembly 200 and illustratively acts as a light amplifying medium.

Upon active region 206 is grown p-type top mirror 208, upon which p-type contact material 207 is deposited.

Upon p-type top mirror 208 is grown the n-type transparent layer 211 of the photodetector 210. Contact 207 is realized to both the p-type top mirror 208 and the n-type transparent layer 211 either through the use of two different metals or by a single metal. As can be seen, as an improvement to the structure discussed with respect to FIG. 2A, contact material 207 contacts both p-type top mirror 208 of laser 220 and n-type transparent layer 211 of photodetector 210, effectively connecting p-type top mirror 208 to n-type transparent layer 211. By shorting, or shunting, the junction 215 formed at the intersection of p-type top mirror 208 of laser 220 and n-type transparent layer 211 of photodetector 210, the voltage required to bias the laser and photodetector can be further reduced and will be described in detail below with respect to FIG. 3B.

Still referring to FIG. 3A, a third PN junction is formed over n-type transparent layer 211 in the form of absorbing layer 212 and a top p-type transparent layer 214. The resulting structure exhibits a PNPN configuration similar to that described with respect to FIG. 2A. Over the top p-type transparent layer 214 is deposited p-type contact material 216 approximately as shown. The arrow above laser and photodetector assembly 200 indicates the light output of this first alternative embodiment. It should be noted that the material layers can be reversed (i.e., all n-type layers replaced with p-type layers and all p-type layers replaced with n-type layers) without departing from the concept of the invention.

Contact layer 201, which contacts n-type substrate layer 202, contact layer 207, which contacts p-type top mirror 208 and n-type transparent layer 211, and p-type contact layer 216, which contacts the top p-type transparent layer 214 of photodetector 210 form the three contacts that, together with the aforementioned photodetector structure having the n-type transparent layer 211 shorted to the p-type top mirror 208 of VCSEL 220, enable the laser and photodetector to require a very low bias voltage, the circuitry of which will be described below.

Figure 3B:
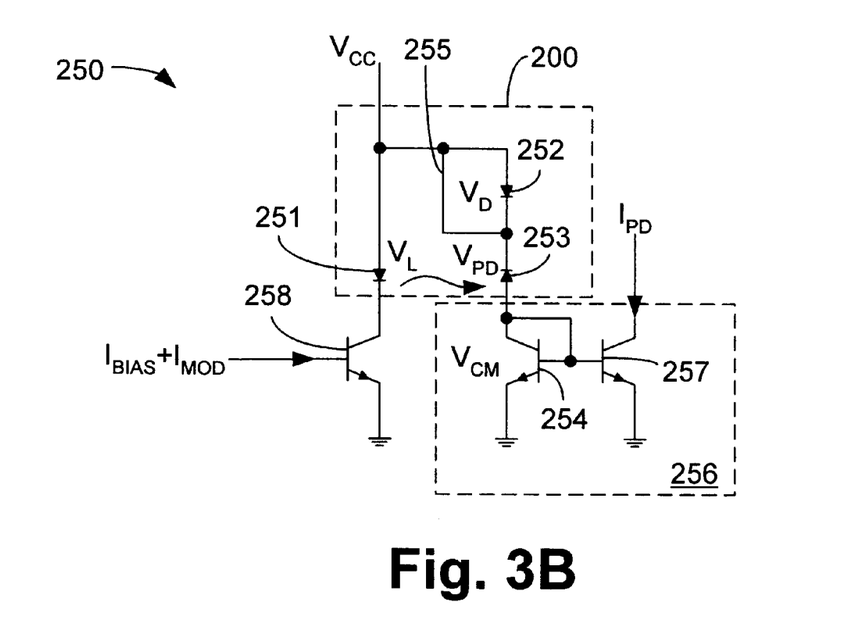
FIG. 3B is a schematic representation of the laser and photodetector of FIG. 3A including simplified external biasing circuitry associated therewith.

FIG. 3B is a schematic representation 250 of the laser and photodetector 200 of FIG. 3A including external biasing circuitry associated therewith, which will be used to illustrate the low bias voltage operation of the first alternative embodiment.

Illustratively, the laser and photodetector 200 are shown as diodes 251, 252, and 253 enclosed in the dotted box 200. The voltage across diode 251 represents the voltage $V_L$ across VCSEL 220, the voltage $V_D$ across diode 252 represents the forward bias voltage across PN junction 215 at the photodetector operating current, and the voltage $V_{PD}$ across diode 253 represents the reverse bias voltage across the photodetector 210.

As can be seen by the addition of shunt 255, which represents the contact 207 that shorts p-type top mirror 208 of laser 220 and n-type transparent layer 211 of photodetector 210, the voltage across parasitic PN junction 215 is eliminated. Contact 207 is constructed of both p-type and n-type material, either by the use of two different metals or by a single metal.

Remember that the circuit bias voltage must be greater than the sum of the minimum operating bias voltages for each element of the circuit and is given by $$V_{CC} > V_D + V_{PD} + V_{CM} \quad \text{(Equation 2)}$$

where $V_D$ is the forward bias voltage of the parasitic PN junction 252 at the photodetector 253 operating current, $V_{PD}$ is the reverse bias on the photodetector 253, and $V_{CM}$ is the forward bias voltage on the transistor 254 in the current mirror 256 formed by transistors 254 and 257. By employing shunt 255, the parasitic voltage $V_D$ is eliminated resulting in a bias voltage requirement of $$V_{CC} > V_{PD} + V_{CM} \quad \text{(Equation 3)}$$

To illustrate with an example, assuming the aforementioned typical values of $V_D \approx 1.2V$, $V_{PD} \approx 0.5V$, and $V_{CM} \approx 0.8V$, but with $V_D$ eliminated, the result is $V_{CC} > 1.3V$. The quoted voltage across the parasitic PN junction 215 ($V_D \approx 1.2V$) is typical of a gallium arsenide homojunction. In addition, $V_{CM} \approx 0.8V$ corresponds to a silicon bipolar transistor and may be greater or less than 0.8V depending upon the transistor used and the material of which the transistor is constructed. However, now the $V_{CC}$ value is limited by the voltage necessary to bias the laser $V_L$ and the driving transistor 258, which will likely be greater than 1.3V. Therefore, in this application $V_{CC}$ is not limited by the photodetector circuit, rather the $V_{CC}$ value is limited by the laser and the driving transistor.

It is important to note that the shunt 255 used to bypass the parasitic PN junction 252 may have non-vanishing resistance or non-vanishing voltage drop at the detector operating current due to the nature of the semiconductor-to-metal contact. However, so long as the overall voltage drop across the shunt at the detector operating current is lower than that of the parasitic PN junction at the same current, an improvement in the bias voltage will be realized.

It should be evident that the first alternative embodiment 200 of the laser and photodetector of FIG. 2A exhibits the desired relative polarity between the laser and the photodetector within a three-terminal device. This arrangement enables the use of a single power supply to simultaneously forward-bias the laser and reverse-bias the photodetector. It should be furthermore evident that in the same configuration the laser current and the photodetector current separately depend on the individual bias conditions of the laser and the photodetector, and are entirely independent of each other. The latter constitutes the electrical de-coupling feature of the laser and the photodetector.

Figure 4:
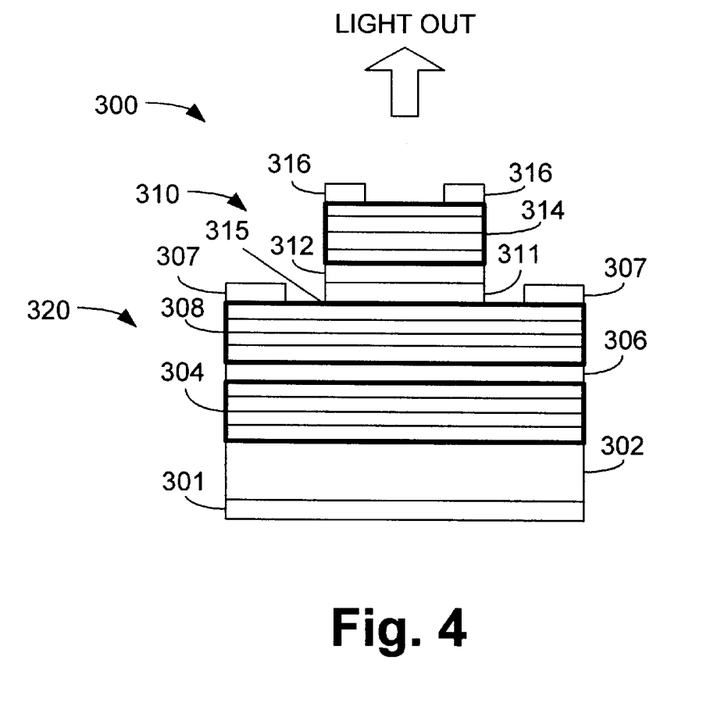
FIG. 4 is a cross-sectional view of a second alternative embodiment of the laser and photodetector of FIG. 2A.

FIG. 4 is a cross-sectional view of a second alternative embodiment of the laser and photodetector of FIG. 2A. Laser and photodetector 300 illustrates one possible combination wherein a photodetector and the parasitic PN junction are embedded in one of the mirrors of a laser device. This arrangement can minimize the capture of omnidirectional spontaneous emission by the absorbing layer. The absorbing layer 312, being either quantum well or bulk semiconductor, and the parasitic junction 315 may be placed anywhere within laser 320, while still maintaining the PNPN configuration. This enables the integrated laser and photodetector structure to operate at a bias voltage lower than prior art and still allow the laser and the photodetector to remain electrically decoupled. The structure of this second alternative embodiment is similar to that described with respect to FIG. 2A, therefore like items will have a prefix of "3" and will be referred to as 3XX, with the XX denoting like items in FIG. 2A having similar structure, the detailed explanation of which will be omitted.

Referring again to FIG. 4, p-type material layer 114 of photodetector 110 (FIG. 2A) is replaced by p-type mirror 314. The placement of p-type mirror 314 integrates photodetector 310 and laser 320 into an integrated structure.

Figure 5:
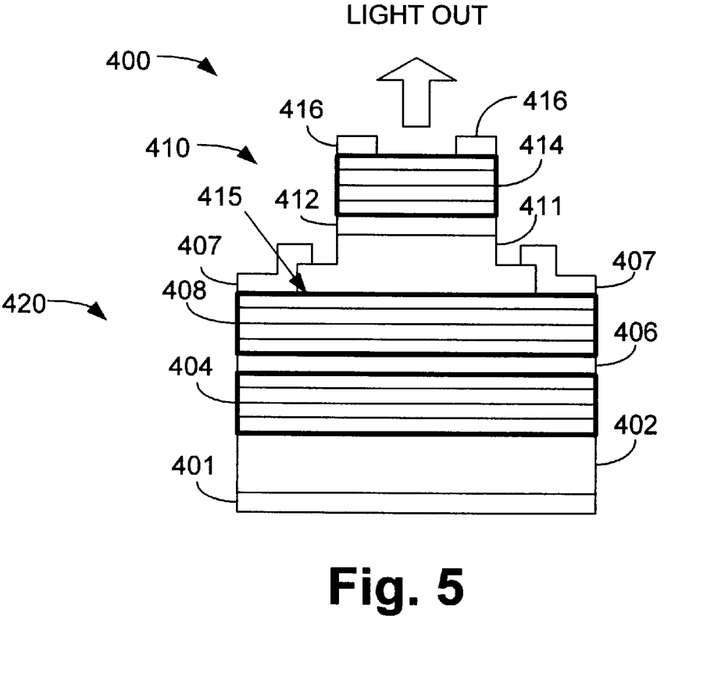
FIG. 5 is a cross-sectional view of a third alternative embodiment of the laser and photodetector of FIG. 3A.

FIG. 5 is a cross-sectional view of a third alternative embodiment of the laser and photodetector of FIG. 3A. Laser and photodetector 400 illustrates yet another possible combination wherein the photodetector 410 is again embedded within laser 420. However, the laser and photodetector 400 of FIG. 5 further incorporate the shunt described in FIG. 3A. The structure of this third alternative embodiment is similar to that described with respect to FIG. 3A, therefore like items will have a prefix of "4" and will be referred to as 4XX, with the XX denoting like items in FIG. 3A having similar structure, the detailed explanation of which will be omitted.

Referring again to FIG. 5, as discussed with respect to FIG. 3A, the junction formed at the intersection of the p-type top mirror 408 of the laser and the n-type transparent layer 411 of the photodetector is shorted, or shunted, by contact material 407. Contact material 407 contacts both p-type top mirror 408 and n-type transparent layer 411, effectively connecting p-type top mirror 408 to n-type transparent layer 411.

It will be obvious to those skilled in the art that many modifications and variations may be made to the preferred embodiments of the present invention, as set forth above, without departing substantially from the principles of the present invention. For example, the system and method for the monolithic integration of a laser and photodetector for low bias voltage operation can be implemented using various semiconductor technology. Furthermore, while illustrated herein as a photodetector residing either upon or within a laser structure, the photodetector may also be grown prior to the laser, and may reside either above or below the laser structure. All such modifications and variations are intended to be included herein within the scope of the present invention, as defined in the claims that follow.

What is claimed is:

1. A three terminal structure for measuring an output of a light emitting device, comprising:

a light emitting device having a first contact and a light emitting device operating current;

a photodetector optically coupled to said light emitting device, said photodetector having a second contact and a photodetector operating current;

a pn junction formed at an intersection of said light emitting device and said photodetector; and a third contact across said pn junction.

2. The system as defined in claim 1, wherein said light emitting device is a vertical cavity surface emitting laser.

3. The system as defined in claim 1, wherein said light emitting device and said photodetector are collectively configured in a PNPN configuration.

4. The system as defined in claim 1, wherein said system includes three PN junctions.

5. The system as defined in claim 1, wherein said photodetector and said PN junction are located within said light emitting device.

* * * * *